United States Patent
Min et al.

(10) Patent No.: US 11,543,699 B2
(45) Date of Patent: Jan. 3, 2023

(54) COLOUR CONVERSION FILM, AND BACK LIGHT UNIT AND DISPLAY DEVICE COMPRISING SAME

(71) Applicant: LG CHEM, LTD., Seoul (KR)

(72) Inventors: Sung Yong Min, Daejeon (KR); Dong Mok Shin, Daejeon (KR); Nari Kim, Daejeon (KR); Ji Ho Kim, Daejeon (KR); Hye Mi Oh, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 17/048,661

(22) PCT Filed: Nov. 11, 2019

(86) PCT No.: PCT/KR2019/015234
§ 371 (c)(1),
(2) Date: Oct. 19, 2020

(87) PCT Pub. No.: WO2020/101296
PCT Pub. Date: May 22, 2020

(65) Prior Publication Data
US 2021/0165275 A1   Jun. 3, 2021

(30) Foreign Application Priority Data

Nov. 12, 2018   (KR) .................. 10-2018-0138420

(51) Int. Cl.
| | | |
|---|---|---|
| *G02F 1/1335* | (2006.01) |
| *G02F 1/13357* | (2006.01) |
| *G02B 1/14* | (2015.01) |
| *C09K 11/06* | (2006.01) |
| *G02B 5/28* | (2006.01) |

(52) U.S. Cl.
CPC ........ *G02F 1/133602* (2013.01); *C09K 11/06* (2013.01); *G02B 1/14* (2015.01); *G02B 5/28* (2013.01); *C09K 2211/1022* (2013.01); *G02B 2207/113* (2013.01); *G02F 2202/36* (2013.01)

(58) Field of Classification Search
CPC ...... G02F 1/133602; G02B 1/14; C09K 11/06
USPC ...................................... 362/97.1
See application file for complete search history.

(56) References Cited

U.S. PATENT DOCUMENTS

| | | |
|---|---|---|
| 10,927,293 B2 | 2/2021 | Shin et al. |
| 2012/0052608 A1 | 3/2012 | Yoo et al. |

(Continued)

FOREIGN PATENT DOCUMENTS

| | | |
|---|---|---|
| CN | 105670601 A | 6/2016 |
| CN | 107603392 A | 1/2018 |

(Continued)

OTHER PUBLICATIONS

Fukano, "Thermal Accumulation Material for Textile—Technical leaflet of PCM", Venture Chemical Ltd., 2011, p. 1-12.

(Continued)

*Primary Examiner* — Christopher M Raabe
(74) *Attorney, Agent, or Firm* — Rothwell, Figg, Ernst & Manbeck, P.C.

(57) ABSTRACT

The present specification relates to a color conversion film comprising a color conversion functional layer including a microcapsule phase change material, and a backlight unit and a display apparatus including the same.

12 Claims, 2 Drawing Sheets

(56) References Cited

U.S. PATENT DOCUMENTS

| | | | |
|---|---|---|---|
| 2016/0091640 A1* | 3/2016 | Wu | G02B 5/22 |
| | | | 359/891 |
| 2016/0161770 A1* | 6/2016 | Joo | G02F 1/1335 |
| | | | 359/241 |
| 2016/0223269 A1 | 8/2016 | Hartmann et al. | |
| 2016/0376458 A1 | 12/2016 | Kim | |
| 2017/0373229 A1 | 12/2017 | Shin et al. | |
| 2018/0097158 A1* | 4/2018 | Estrada | C09C 1/0081 |
| 2018/0230374 A1 | 8/2018 | Ito et al. | |
| 2018/0274753 A1 | 9/2018 | Sakaino et al. | |
| 2019/0048255 A1 | 2/2019 | Sakaino | |
| 2019/0093008 A1 | 3/2019 | Shin et al. | |

FOREIGN PATENT DOCUMENTS

| | | |
|---|---|---|
| JP | 2017-043682 A | 3/2017 |
| JP | 2018-507773 A | 3/2018 |
| JP | 2018506060 A | 3/2018 |
| JP | 2018-088401 A | 6/2018 |
| KR | 2002-0078220 A | 10/2002 |
| KR | 2010-0111975 A | 10/2010 |
| KR | 10-2011-0104382 A | 9/2011 |
| KR | 10-1253586 B1 | 4/2013 |
| KR | 2014-0114163 A | 9/2014 |
| KR | 2016-0147645 A | 12/2016 |
| KR | 2017-0001561 A | 1/2017 |
| KR | 10-1760840 B1 | 7/2017 |
| KR | 2018-0007870 A | 1/2018 |
| KR | 10-1843854 B1 | 3/2018 |
| KR | 2018-0103326 A | 9/2018 |
| KR | 2018-0114016 A | 10/2018 |
| WO | 2017-183854 A1 | 10/2017 |

OTHER PUBLICATIONS

International Search Report issued for International Application No. PCT/KR2019/015234 dated Feb. 20, 2020, 5 pages.

"Preparation and Characterization of Micro-Capuled Phase Change Materials Containing Binary Core Materials"; China Master's Theses Full-text Database Engineering Technology Series 1, No. 5, 2011, (68 pages).

* cited by examiner

[FIG. 1]
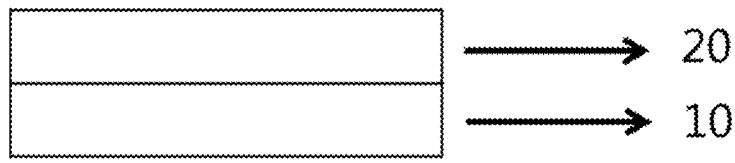
[FIG. 2]
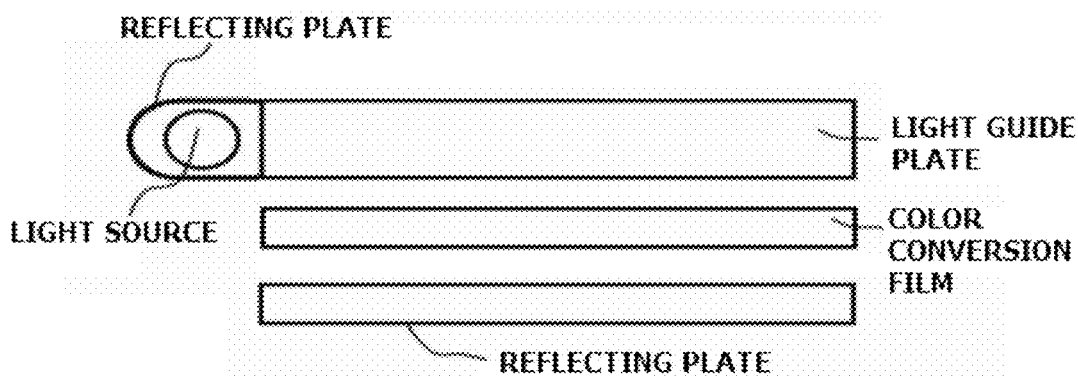
[FIG. 3]
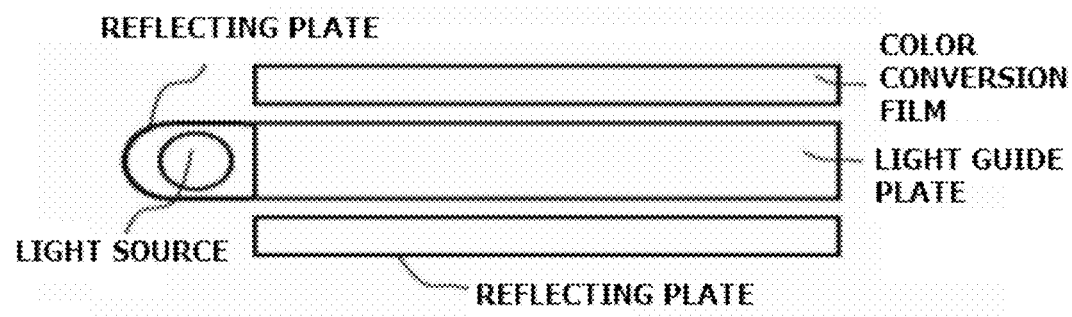
[FIG. 4]
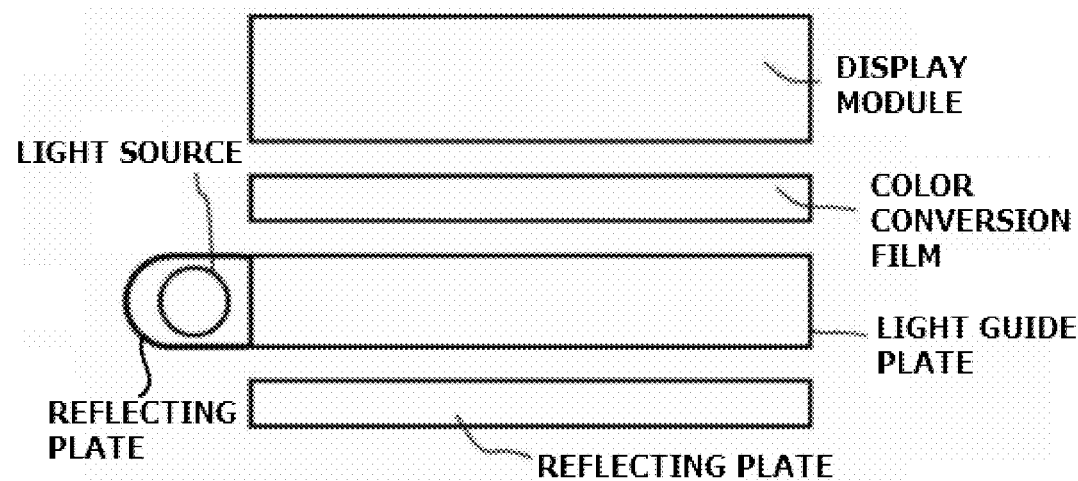

[FIG. 5]
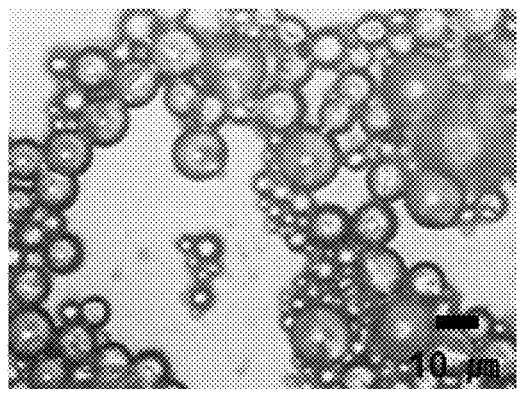
[FIG. 6]
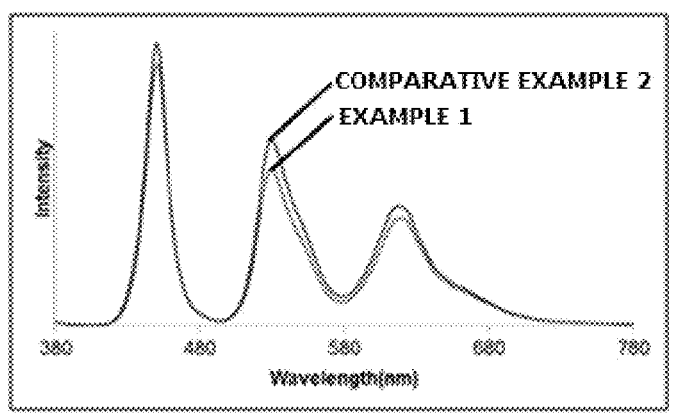
[FIG. 7]
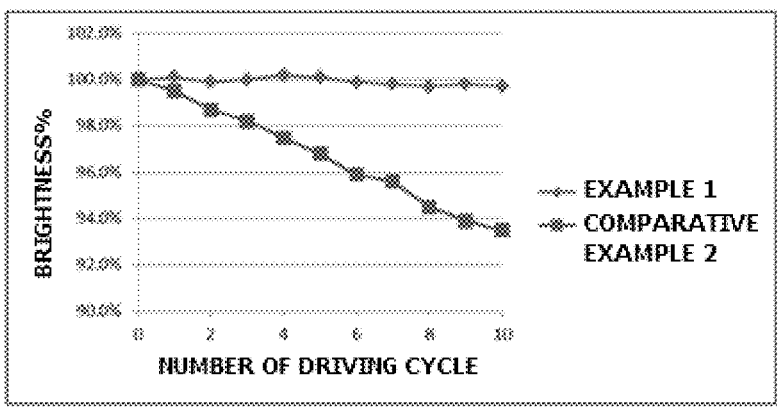

COLOUR CONVERSION FILM, AND BACK LIGHT UNIT AND DISPLAY DEVICE COMPRISING SAME

TECHNICAL FIELD

This application is a 35 U.S.C. 371 National Phase Entry Application from PCT/KR2019/015234 filed on Nov. 11, 2019, designating the United States, which claims priority to and the benefits of Korean Patent Application No. 10-2018-0138420, filed with the Korean Intellectual Property Office on Nov. 12, 2018, the entire contents of which are incorporated herein by reference.

The present specification relates to a color conversion film, and a backlight unit and a display apparatus including the same.

BACKGROUND

Development of a color conversion film using various materials has been progressed recently for improving color gamut of LCD displays such as TVs.

A color conversion film generally has a problem of reducing durability by accelerating degradation due to heat, oxygen or the like together with light. Accordingly, there have been demands for material selection and structure improvements capable of reducing their effects.

Particularly, enhancing heat resistance properties is essential in a color conversion film due to its inevitable exposure to the heat of a backlight and the like generated during display driving.

There have been attempts in the art to enhance thermal stability through substituting a functional group of a fluorescent substance, introducing a resin with high heat resistance, and the like, however, enhancing heat resistance has been limited since heat transfer to a color conversion layer itself has not been prevented. Accordingly, new technologies capable of preventing film degradation caused by heat have been required.

BRIEF SUMMARY OF DISCLOSURE

The present specification provides a color conversion film, and a backlight unit and a display apparatus including the same.

One embodiment of the present specification provides a color conversion film including a substrate film; and a color conversion functional layer provided on the substrate film, wherein the color conversion functional layer includes a microcapsule phase change material including a shell and a core, and, the core comprises the phase change material which is at least one selected from the group consisting of an organic monomer, a polymer and an inorganic salt hydrate.

Another embodiment of the present specification provides a method for preparing a color conversion film, the method including preparing a substrate film; and forming a color conversion functional layer including a microcapsule phase change material including a shell and a core on the substrate film, wherein the core comprises the phase change material which is at least one selected from the group consisting of an organic monomer, a polymer and an inorganic salt hydrate.

Another embodiment of the present specification provides a backlight unit including the color conversion film described above.

Another embodiment of the present specification provides a display apparatus including the backlight unit described above.

Advantageous Effects

A color conversion film according to one embodiment of the present specification prevents absorption of heat generated during display driving to a color conversion layer by a heat absorbing function obtained by a phase transition of a phase change material in the color conversion film, and as a result, degradation of the color conversion film is reduced.

In addition, by using a phase change material having a microcapsule structure herein, the phase change material does not flow out of a resin even when liquefied by heat, and therefore, a usable content can be increased.

BRIEF DESCRIPTION OF DRAWINGS

FIG. 1 is a mimetic diagram of a color conversion film according to one embodiment of the present specification.

FIGS. 2 and 3 are mimetic diagrams illustrating structures of a backlight unit according to one embodiment of the present specification.

FIG. 4 is a mimetic diagram illustrating a structure of a display apparatus according to one embodiment of the present specification.

FIG. 5 shows a microcapsule phase change material according to one embodiment of the present specification.

FIG. 6 is a graph showing light emission spectra of a color conversion film according to one embodiment of the present specification and a film of a comparative example.

FIG. 7 is a graph showing changes in the color conversion film brightness depending on repeated driving of color conversion films prepared according to an example according to one embodiment of the present specification and a comparative example.

REFERENCE NUMERAL

10: Substrate Film
20: Color Conversion Functional Layer

DETAILED DESCRIPTION OF DISCLOSURE

Hereinafter, the present specification will be described in more detail.

In the present specification, a description of one member being placed "on" another member includes not only a case of the one member being in contact with the another member but a case of still another member being present between the two members.

In the present specification, a description of a certain part "including" certain constituents means capable of further including other constituents, and does not exclude other constituents unless particularly stated on the contrary.

One embodiment of the present specification provides a color conversion film including a substrate film; and a color conversion functional layer provided on the substrate film, wherein the color conversion functional layer includes a microcapsule phase change material including a shell and a core, and the core comprises the phase change material which is at least one selected from the group consisting of an organic monomer, a polymer and an inorganic salt hydrate.

In one embodiment of the present specification, the substrate film may function as a support when preparing the color conversion film. The substrate film is not limited in the type or thickness as long as it is transparent and capable of functioning as a support, and those known in the art may be used. Herein, being transparent means visible light transmittance being 70% or higher. For example, a PET film may be used as the substrate film.

According to one embodiment of the present specification, the color conversion functional layer may include a color conversion layer alone; or a color conversion layer and a phase transformation layer. In addition, the microcapsule phase change material may be included in the color conversion layer or the phase transformation layer. When the microcapsule phase change material is included in the color conversion layer, the color conversion functional layer may be formed in a single layer, and when the microcapsule phase change material is included in the phase transformation layer, the color conversion functional layer may be formed in a plurality of layers. Including the microcapsule phase change material in the color conversion layer may be effective in simplifying a process compared to including the microcapsule phase change material in the phase transformation layer.

According to one embodiment of the present specification, the content of the microcapsule phase change material may be from 10 parts by weight to 80 parts by weight with respect to 100 parts by weight of the color conversion functional layer. In addition, according to one embodiment of the present specification, the content of the microcapsule phase change material may be from 10 parts by weight to 80 parts by weight with respect to 100 parts by weight of the color conversion layer. In addition, according to one embodiment of the present specification, the content of the microcapsule phase change material may be from 10 parts by weight to 80 parts by weight with respect to 100 parts by weight of the phase transformation layer. When introducing a content of less than 10 parts by weight, a heat absorbing ability of the corresponding layer is reduced resulting in an insignificant durability enhancing effect, and when introducing a content of greater than 80 parts by weight, viscosity of the coating solution decreases declining processability.

According to one embodiment of the present specification, the color conversion functional layer further includes a resin, and the content of the microcapsule phase change material may be greater than or equal to 5 parts by weight and less than or equal to 100 parts by weight with respect to 100 parts by weight of the resin. Specifically, the content may be 5 parts by weight or greater, 10 parts by weight or greater, 15 parts by weight or greater, 20 parts by weight or greater, 25 parts by weight or greater, 30 parts by weight or greater, 35 parts by weight or greater, 40 parts by weight or greater, 45 parts by weight or greater or 50 parts by weight or greater, and may be 95 parts by weight or less, 90 parts by weight or less, 85 parts by weight or less, 80 parts by weight or less, 75 parts by weight or less or 70 parts by weight or less.

The phase change material absorbs heat by causing a phase transition in a certain temperature range, and through such heat absorption, heat transfer to the color conversion layer may be prevented. Specifically, the phase change material may cause a solid-liquid phase transition at 30° C. to 80° C. When a phase transition occurs at a temperature of lower than 30° C., an effect of stabilization obtained by heat absorption may not be significant in a driving temperature range of the color conversion film, and when a phase transition occurs at a temperature of higher than 80° C., a heat absorbing ability of the phase change material is reduced causing degradation by transferring much heat to the color conversion layer.

The phase change material according to one embodiment of the present specification may be a capsule type formed with a shell and a core. Specifically, the shell may be selected from the group consisting of urea-formaldehyde, melamine-formaldehyde, a polyurethane resin, a polyurea resin, an epoxy resin, gelatin and a polyacrylic resin. The shell made of the above-mentioned material effectively prevents core contents from escaping to the outside, and is thereby capable of preventing heat transfer to the color conversion layer while preventing contamination of the color conversion film.

According to one embodiment of the present specification, the organic monomer may be at least one selected from the group consisting of a paraffin-based compound, a fatty acid-based compound, an alcohol-based compound and a carbonate-based compound.

The paraffin-based compound is not particularly limited, but may be at least one selected form the group consisting of n-nonadecane, n-eicosane, n-heneicosane, n-docosane, n-tricosane, n-tetracosane, n-pentacosane, n-hexacosane, n-heptacosane and n-octacosane.

The fatty acid-based compound is not particularly limited, but may be at least one selected form the group consisting of capric acid, lauric acid and myristic acid.

The alcohol-based compound is not particularly limited, but may be at least one selected form the group consisting of 1-dodecanol and 1-tetradecanol.

The carbonate-based compound is not particularly limited, but may be at least one selected form the group consisting of tetradecyl carbonate, hexadecyl carbonate and octadecyl carbonate.

According to one embodiment of the present specification, the polymer may be at least one selected form the group consisting of poly(ethylene glycol), poly(propylene oxide) (PPO) and polytetrahydrofuran (PTHF).

According to one embodiment of the present specification, the inorganic salt hydrate may be at least one selected form the group consisting of $LiNO_3.3H_2O$, $Na_2SO_4.10H_2O$, $NaCH_3COO.3H_nO$, $CaBr_2.6H_2O$, $Na_2HPO_4.12H_2O$, $ZN(NO_3)_2.nH_2O$, $Na_2S_2O_3.5H_2O$ and $Cd(NO_3)_2.4H_2O$.

According to one embodiment of the present specification, a protective film may be further included on the color conversion functional layer.

According to one embodiment of the present specification, the color conversion functional layer includes an organic fluorescent dye, and the organic fluorescent dye includes any one or more selected from the group consisting of BODIPY-based derivatives, acridine-based derivatives, xanthene-based derivatives, arylmethane-based derivatives, coumarin-based derivatives, polycyclic aromatic hydrocarbon-based derivatives, polycyclic hetero aromatic-based derivatives, perylene-based derivatives, pyrrole-based derivatives and pyrene-based derivatives. Specifically, the organic fluorescent dye includes one or two types of the above-described materials. More specifically, the organic fluorescent dye uses a BODIPY-based organic fluorescent dye.

In one embodiment of the present specification, the organic fluorescent dye absorbs light selected in a near-ultraviolet to visible region, and dyes emitting light having a different wavelength from the absorbing light may be used.

In one embodiment of the present specification, the organic fluorescent dye has a molecular absorption coefficient of 50,000 $M^{-1}cm^{-1}$ to 150,000 $M^{-1}cm^{-1}$.

FIG. 1 illustrates a color conversion film according to one embodiment of the present specification. Specifically, FIG. 1 illustrates a color conversion film in which a color conversion functional layer (20) is coated on a substrate film (10).

One embodiment of the present specification provides a method for preparing a color conversion film, the method including preparing a substrate film; and forming a color conversion functional layer including a microcapsule phase change material including a shell and a core on the substrate film, wherein the core comprises the phase change material which is at least one selected from the group consisting of an organic monomer, a polymer and an inorganic salt hydrate.

In one embodiment of the present specification, the forming of a color conversion functional layer may include preparing a resin solution in which a resin, a solvent, a microcapsule phase change material and an organic fluorescent dye are mixed; forming a color conversion functional layer including the microcapsule phase change material by coating the resin solution on the substrate film; and drying the color conversion functional layer including the microcapsule phase change material formed on the substrate film.

In one embodiment of the present specification, the forming of a color conversion functional layer may include forming a color conversion layer on the substrate film; and forming a phase transformation layer including the microcapsule phase change material on the color conversion layer.

One embodiment of the present specification provides a method for preparing a color conversion film, the method including preparing a substrate film; preparing a resin solution in which a resin, a solvent, a microcapsule phase change material and an organic fluorescent dye are mixed; forming a color conversion functional layer including the microcapsule phase change material by coating the resin solution on the substrate film; and drying the color conversion functional layer including the microcapsule phase change material formed on the substrate film.

Another embodiment of the present specification provides a method for preparing a color conversion film, the method including preparing a substrate film; preparing a resin solution in which a resin, a solvent and an organic fluorescent dye are mixed; forming a color conversion layer by coating the resin solution on the substrate film; drying the color conversion layer coated on the substrate film;

forming a phase transformation layer by coating a phase change solution including a microcapsule phase change material and a solvent on the dried color conversion layer; and drying the phase transformation layer.

In one embodiment of the present specification, the preparing of a substrate film may be preparing a substrate film through extrusion or coating, or preparing by purchasing a commercially-available substrate film.

Another embodiment of the present specification provides a method for preparing a color conversion film, the method including preparing a first substrate film and a second substrate film; preparing a resin solution in which a resin, a solvent and an organic fluorescent dye are mixed; forming a color conversion layer by coating the resin solution on the first substrate film; drying the color conversion layer coated on the first substrate film; preparing a phase change solution in which a resin, a solvent and a microcapsule phase change material are mixed; forming a phase transformation layer by coating the phase change solution on the second substrate film; drying the phase transformation layer coated on the second substrate film; and laminating the color conversion layer and the phase transformation layer by providing an adhesive film therebetween.

The substrate film of the first substrate film and the second substrate film are the same as described above, and the preparation method according to one embodiment of the present specification may include preparing each of a color conversion layer and a phase transformation layer by providing a separate substrate film, and extrusion molding the layers through an adhesive film The adhesive film is for adhering the two layers, and the type is not particularly limited.

In one embodiment of the present specification, the resin includes both a thermoplastic resin and a thermocurable resin, and although not particularly limited in the type, poly(meth)acryl-based such as polymethyl methacrylate (PMMA), polycarbonate-based (PC), polystyrene-based (PS), polyethylene-based, polyethylene glycol-based, polyarylene-based (PAR), polyurethane-based (TPU), styrene-acrylonitrile-based (SAN), polyvinylidene fluoride-based (PVDF), modified polyvinylidene fluoride-based (modified-PVDF) and the like may be used.

In one embodiment of the present specification, the resin may exhibit transparent properties. Herein, being transparent means visible light transmittance being 75% or higher.

In one embodiment of the present specification, the solvent may be dimethylformamide, N,N-dimethylacetamide, pyridine, 2-methylpyridine, 4-methylpyridine, butyl acetate, n-propyl acetate, ethyl acetate, xylene, toluene, cyclohexanone, methyl ethyl ketone, methyl isobutyl ketone or a combination thereof. More specifically, as the solvent, the above-described solvents may be used either alone or as a mixture of two types.

In one embodiment of the present specification, the substrate film may have a thickness of 1 μm to 100 μm. More specifically, the thickness may be from 10 μm to 90 μm, and preferably from 20 μm to 80 μm.

In one embodiment of the present specification, the organic fluorescent dye is present in a form dispersed into the resin.

The content of the organic fluorescent dye is from 0.005 parts by weight to 2 parts by weight based on 100 parts by weight of the resin.

In one embodiment of the present specification, the color conversion film according to the embodiments described above additionally includes light diffusing particles. By dispersing light diffusing particles into the color conversion film instead of a light diffusing film having been used in the art to enhance brightness, higher brightness may be obtained compared to using a separate light diffusing film, and an adhering process may be skipped as well.

As the light diffusing particles, particles having a high refractive index than the resin may be used, and examples thereof may include air or other gases, air- or gas-filled hollow beads or particles (for example, air/gas-filled glass or polymers) including $TiO_2$, silica, borosilicate, alumina, or sapphire; polymer particles including polystyrene, polycarbonate, polymethyl methacrylate, acryl, methyl methacrylate, styrene, melamine resin, formaldehyde resin, or melamine and formaldehyde resins; or combinations thereof.

The light diffusing particles may have a particle diameter in a range of 0.1 μm to 5 μm. The content of the light diffusing particles may be determined as necessary, and the content of the light diffusing particles may be from approximately 1 parts by weight to 30 parts by weight with respect to 100 parts by weight of the resin solid content In one embodiment of the present specification, the color conversion film has a thickness of 2 µm to 200 µm.

In one embodiment of the present specification, the color conversion film may exhibit high brightness even with a small thickness of 2 µm to 20 µm. This is due to the fact that the content of the fluorescent substance molecules included in the unit volume is higher than the content of quantum dots. For example, a color conversion film having a 5 µm thickness using an organic fluorescent dye content of 0.5 wt % with respect to the resin solid content may exhibit high brightness of 4000 nit or greater based on the brightness of 600 nit of a blue backlight unit (blue BLU).

As necessary, the substrate film may be replaced by a barrier film, or a bather film may be provided on one surface or both surfaces of the substrate film.

The barrier film is not particularly limited as long as it is capable of blocking moisture or oxygen, and those known in the art may be used. For example, the barrier film includes a bather layer having transmittance of $10^{-1}$ cc/m$^2$/day for at least one of moisture and oxygen. For example, the bather layer may include aluminum oxides or nitrides, and ionic metal oxides providing moisture or oxygen barrier properties. The barrier film may further include a buffer layer formed with one or more types selected from among sol-gel-based, acryl-based, epoxy-based and urethane-based coating solution compositions.

As one example, the bather film may include an organic-inorganic hybrid coating layer, an inorganic material layer, and a protective coating layer including inorganic nanoparticles of which surfaces are modified with organosilane provided on one surface or both surfaces of the substrate film. Herein, the inorganic material layer may be formed with metal oxides or nitrides. The inorganic nanoparticles may be nanoparticles of alumina, silica, zinc oxide, antimony oxide, titanium oxide or zirconium oxide. The organic-inorganic hybrid coating layer may be formed by curing an organosilane—including coating composition in a sol state by heat or UV, and the coating solution composition in a sol state may include proper additive, solvent, polymerization catalyst and the like together with organosilane.

In one embodiment of the present specification, an adhesive or gluing layer may be provided on one surface of the color conversion film. Specifically, an adhesive or gluing layer may be provided on one surface of the color conversion layer not provided with the substrate film. As components forming the adhesive or gluing layer, those used in the art may be used without limit.

In the color conversion film described above, the color conversion layer may be prepared using a method including coating a resin solution in which a resin, a solvent and an organic fluorescent dye are dissolved on a substrate film; first drying the resin solution coated on the substrate film; and additionally second drying the resin solution coated on the substrate film after the first drying, or a method including extruding an organic fluorescent material with a resin.

In the resin solution, the above-described organic fluorescent dye is dissolved, and therefore, the organic fluorescent dye is homogeneously distributed in the solution. This is different from a quantum dot film preparation process requiring a separate dispersion process.

In one embodiment of the present specification, the organic fluorescent dye-dissolved resin solution is not particularly limited in the preparation method as long as the organic fluorescent dye and the resin described above are dissolved in the solution.

According to one example, the organic fluorescent dye-dissolved resin solution may be prepared using a method of preparing a first solution by dissolving an organic fluorescent dye in a solvent, preparing a second solution by dissolving a resin in a solvent, and mixing the first solution and the second solution. When mixing the first solution and the second solution, it is preferred that these be homogeneously mixed. However, the method is not limited thereto, and a method of simultaneously adding and dissolving an organic fluorescent dye and a resin in a solvent, a method of dissolving an organic fluorescent dye in a solvent and subsequently adding and dissolving a resin, a method of dissolving a resin in a solvent and then subsequently adding and dissolving an organic fluorescent dye, and the like, may be used.

The microcapsule phase change material and the organic fluorescent dye included in the solution are the same as described above.

In one embodiment of the present specification, instead of the resin included in the resin included in the solution, a monomer curable into a thermoplastic resin; or a mixture of a thermoplastic resin and a monomer curable into a thermoplastic resin can be used. For example, the monomer curable by a thermoplastic resin includes a (meth)acryl-based monomer, and this may be formed as a resin matrix material by UV curing. When using such a curable monomer, an initiator required for curing may be further added as necessary.

When using the first solution and the second solution, solvents included in each of these solutions may be the same as or different from each other. Even when different types of solvents are used in the first solution and the second solution, these solvents preferably have compatibility so as to be mixed with each other.

Types of the solvent included in the solution are the same as above.

In one embodiment of the present specification, when using the monomer curable into a thermoplastic resin as the resin included in the solution, curing, for example, UV curing may be conducted before the drying or at the same time as the drying.

When filming an organic fluorescent dye by extruding with a resin, extrusion methods known in the art may be used, and for example, the color conversion layer may be prepared by extruding the organic fluorescent dye with a resin such as polycarbonate-based (PC), poly(meth)acryl-based or styrene-acrylonitrile-based (SAN).

In one embodiment of the present specification, an adhesive or gluing layer may be formed on the color conversion functional layer prepared as above. The adhesive or gluing layer may be formed by coating a composition for forming an adhesive or gluing layer, and then polymerizing or curing the result, or may also be formed by attaching an adhesive or gluing sheet on the color conversion layer.

The adhesive or gluing sheet may be polymerized or cured after being attached to the color conversion layer, but may also be polymerized or cured before the attachment as necessary. As the curing, UV curing may be used. The curing condition may be determined depending on the components and the composition ratio of the composition.

In one embodiment of the present specification, the light diffusing particles may be dispersed into the adhesive or gluing layer by dispersing the light diffusing particles to the composition for forming an adhesive or gluing layer. Herein, the light diffusing particles may be directly dispersed to the composition for forming an adhesive or gluing layer, or a dispersion solution in which the light diffusing particles are dispersed to a separate solvent may be mixed with the composition for forming an adhesive or gluing layer to increase a degree of dispersion of the light diffusing particles. As necessary, a sonicator or a shaker may be used to disperse the light diffusing particles into a solvent By conducting the second drying instead of conducting the first drying for a long period of time, one embodiment of the present specification is effective in improving the generation of heat wrinkles in the film, a problem that may occur when conducting the first drying for a long period of time.

Another embodiment of the present specification provides a backlight unit including the color conversion film described above. The backlight unit may have backlight unit constitutions known in the art except for including the color conversion film.

FIG. 2 and FIG. 3 illustrate structures of the backlight unit according to one embodiment of the present specification. According to FIG. 2, the color conversion film according to the embodiments described above is provided between a light guide plate and a reflecting plate. According to FIG. 3, the color conversion film according to the embodiments described above is provided on a surface opposite to a surface facing a reflecting plate of a light guide plate. FIGS. 2 and 3 illustrate a constitution including a light source and a reflecting plate surrounding the light source, however, the constitution is not limited to such a structure, and may vary depending on the backlight unit structure known in the art. In addition, as the light source, a direct type as well as a side chain type may be used, and the reflecting plate or the reflective layer may not be included or may be replaced with other constituents as necessary.

Another embodiment of the present specification provides a display apparatus including the backlight unit described above. For example, the display apparatus includes a display module and a backlight unit FIG. 4 illustrates a structure of the display apparatus according to one embodiment of the present specification. According to FIG. 4, the color conversion film according to the embodiments described above is provided on a surface opposite to a surface facing a reflecting plate of a light guide plate, and a display module is provided on the top of the color conversion film. However, the structure of the display apparatus is not limited thereto, and the structure is not particularly limited as long as it includes the backlight unit described above as a constituent As necessary, additional films such as a light diffusing film, a light concentrating film and a brightness enhancing film may be further provided between the display module and the backlight unit The display apparatus is not particularly limited, and may be, for example, a TV, a computer monitor, a laptop, a mobile phone and the like.

Hereinafter, the present specification will be described in detail with reference to examples. However, the examples according to the present specification may be modified to various other forms, and the scope of the present application is not to be construed as being limited to the examples described below. Examples of the present specification are provided in order to more fully describe the present specification to those having average knowledge in the art.

EXAMPLE 1

A green fluorescent substance and a red fluorescent substance of the following structural formulae were dissolved in a molar ratio of 50:1 in a xylene solvent to prepare a first solution.

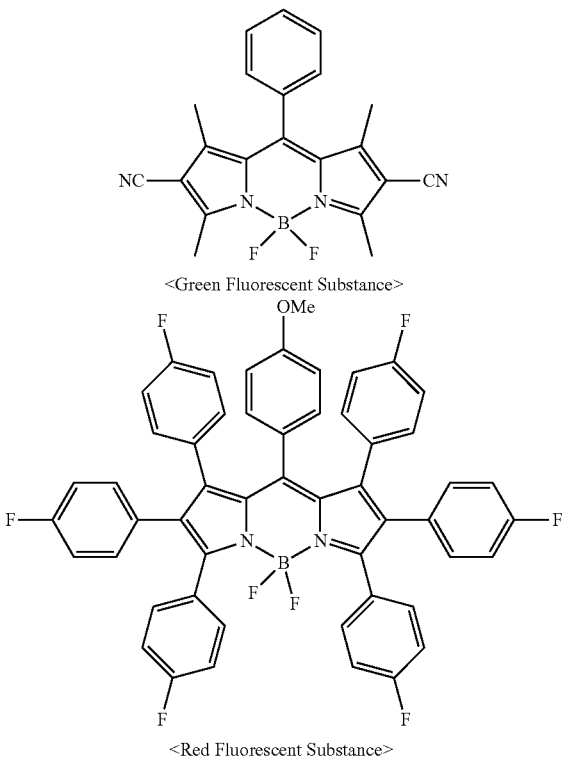

<Green Fluorescent Substance>

<Red Fluorescent Substance>

A thermoplastic resin (PMMA) was dissolved in a xylene solvent to prepare a second solution. The first solution and the second solution were homogeneously mixed so that, with respect to 100 parts by weight of the thermoplastic resin, the content of the green and red fluorescent substances was 0.45 parts by weight, the content of $TiO_2$ particles was 10 parts by weight, and the content of a microcapsule phase change material (Mild Riken Industrial Co., Ltd., PMCD-32SP) was 70 parts by weight. This solution was coated on a PET substrate, and then dried to prepare a color conversion film. Herein, the $TiO_2$ particles may be added and mixed to any one of the first and the second solutions, or a third solution including the $TiO_2$ particles may be prepared, or the $TiO_2$ particles may be introduced when mixing the first and the second solutions.

EXAMPLE 2

A first solution was prepared by dissolving the same green and red fluorescent substances as in Example 1 in a xylene solvent in a molar ratio of 50:1. A thermoplastic resin (PMMA) was dissolved in a xylene solvent to prepare a second solution. The first solution and the second solution were homogeneously mixed so that, with respect to 100 parts by weight of the thermoplastic resin, the content of the green and red fluorescent substances was 0.45 parts by weight, and the content of $TiO_2$ particles was 10 parts by weight. This solution was coated on a PET substrate, and then dried to prepare a color conversion layer. Herein, the $TiO_2$ particles may be added and mixed to any one of the first and the second solutions, or a fourth solution including the $TiO_2$ particles may be prepared, or the $TiO_2$ particles may be introduced when mixing the first and the second solutions.

A microcapsule phase change material (PMCD-32SP, 70 parts by weight with respect to 100 parts by weight of resin) and a resin (PMMA) were dissolved in a xylene solvent to prepare a third solution, and this solution was coated on a separate PET substrate, and then dried to prepare a phase transformation layer. Between the PET substrates each having the color conversion layer and the phase transformation layer formed thereon, an adhesive film was provided, and then the result was laminated to prepare a color conversion film.

COMPARATIVE EXAMPLE 1

A first solution was prepared by dissolving the same green and red fluorescent substances as in Example 1 in a xylene solvent in a molar ratio of 50:1. A thermoplastic resin (PMMA) was dissolved in a xylene solvent to prepare a second solution. A powder-type phase change material (poly (ethylene glycol), PEG) was dissolved in a xylene solvent to prepare a third solution. The first solution, the second solution and the third solution were homogeneously mixed so that, with respect to 100 parts by weight of the thermoplastic resin, the content of the green and red fluorescent substances was 0.45 parts by weight, the content of the phase change material was 70 parts by weight, and the content of $TiO_2$ particles was 10 parts by weight. This solution was coated on a PET substrate, and then dried to prepare a color conversion film.

COMPARATIVE EXAMPLE 2

A color conversion film without using a phase change material was prepared in the same manner as in Example 1 except that the microcapsule phase change material was not used.

Light emission spectrum of each of the color conversion films prepared according to Example 1 and Comparative Example 2 was measured using a spectroradiometer (SR series of TOPCON Corporation). Specifically, the prepared color conversion film was laminated on one surface of a light guide plate of a backlight unit including an LED blue backlight (maximum light emission wavelength 450 nm) and the light guide plate, and after laminating a prism sheet and a DBEF film on the color conversion film, a brightness spectrum of the film was measured, and the results are shown in FIG. 6. In addition, results of measuring brightness and quantum efficiency (QY) of each of the color conversion films are shown in the following Table 1. According to FIG. 6 and Table 1, it was identified that optical properties did not decline much even when introducing the phase change material to the color conversion film.

TABLE 1

|  | Comparative Example 2 | Example 1 |
| --- | --- | --- |
| Relative brightness | 100% | 85.3% |
| Quantum Efficiency | 0.95 | 0.80 |

For each of the color conversion films prepared according to the examples and the comparative examples, repeated driving durability was evaluated. Specifically, the prepared color conversion film was laminated on one surface of a light guide plate of a backlight unit including an LED blue backlight (maximum light emission wavelength 450 nm) and the light guide plate, and a prism sheet, a DBEF film and a reflecting plate were laminated on the color conversion film. In order to simulate a situation of heat generation caused by display driving, the laminated structure was placed on a hot plate and heated to 60° C., and a cycle of driving the backlight for 24 hours, cooling to room temperature for 24 hours and blocking the backlight was repeated 10 times. After each cycle, light emission spectrum of the color conversion film was measured using a spectroradiometer to analyze changes in the optical properties, and the results are shown in FIG. 7 and the following Table 2. In the color conversion film prepared according to Comparative Example 1, the phase change material flowed out of the film during the first driving, and further driving durability evaluation was not able to be progressed, whereas the color conversion film prepared according to Example 1 was stably driven and exhibited enhanced durability despite the high phase change material content.

TABLE 2

| Optical properties after 10 Times of Repeated Driving | Brightness % Compared to Initial Brightness |
| --- | --- |
| Example 1 | 99.7% |
| Example 2 | 98.3% |
| Comparative Example 1 | — |
| Comparative Example 2 | 93.5% |

The invention claimed is:

1. A display apparatus comprising a backlight unit including a color conversion film,
the color conversion film comprising:
a substrate film; and
a color conversion functional layer provided on the substrate film,
wherein the color conversion functional layer includes an organic fluorescent dye, light diffusing particles and a microcapsule phase change material including a shell and a core;
wherein the core comprises a phase change material being at least one selected from an organic monomer, a polymer and an inorganic salt hydrate;
wherein the light diffusing particles comprise particles including TiO2, silica, borosilicate, alumina, or sapphire; polymer particles including polystyrene, polycarbonate, polymethyl methacrylate, acryl, methyl methacrylate, styrene, melamine resin, formaldehyde resin, or melamine and formaldehyde resins; or combinations thereof; and
wherein the organic fluorescent dye includes at least one selected from BODIPY-based derivatives, acridine-based derivatives, xanthene-based derivatives, arylmethane-based derivatives, coumarin-based derivatives, polycyclic aromatic hydrocarbon-based derivatives, polycyclic hetero aromatic-based derivatives, perylene-based derivatives, pyrrole-based derivatives and pyrene-based derivatives.

2. The display apparatus comprising a backlight including the color conversion film of claim 1, wherein the microcapsule phase change material has a phase transition occurring at 30° C. to 80° C.

3. The display apparatus comprising a backlight including the color conversion film of claim 1, wherein the shell is at least one selected from an urea-formaldehyde, a melamine-formaldehyde, a polyurethane resin, a polyurea resin, an epoxy resin, a gelatin and a polyacrylic resin.

4. The display apparatus comprising a backlight including the color conversion film of claim 1, wherein the organic monomer is at least one selected from a paraffin-based compound, a fatty acid-based compound, an alcohol-based compound and a carbonate-based compound.

5. The display apparatus comprising a backlight including the color conversion film of claim 1, wherein the polymer for the phase change material is at least one selected from poly(ethylene glycol), poly(propylene oxide) (PPO) and polytetrahydrofuran (PTHF).

6. The display apparatus comprising a backlight including the color conversion film of claim 1, wherein the inorganic salt hydrate is at least one selected from $LiNO_3 \cdot 3H_2O$, $Na_2SO_4 \cdot 10H_2O$, $NaCH_3COO \cdot 3H_nO$, $CaBr_2 \cdot 6H_2O$, $Na_2HPO_4 \cdot 12H_2O$, $ZN(NO_3)_2 \cdot nH_2O$, $Na_2S_2O_3 \cdot 5H_2O$ and $Cd(NO_3)_2 \cdot 4H_2O$.

7. The display apparatus comprising a backlight including the color conversion film of claim 1, wherein the color conversion functional layer includes a color conversion layer including the microcapsule phase change material.

8. The display apparatus comprising a backlight including the color conversion film of claim 1, wherein the color conversion functional layer includes a color conversion layer and a phase transformation layer, and wherein the phase transformation layer includes the microcapsule phase change material.

9. The display apparatus comprising a backlight including the color conversion film of claim 1, further comprising a protective film on the color conversion functional layer.

10. A method for preparing a display apparatus comprising a backlight unit including a color conversion film, the method comprising:
providing a substrate film; and
forming, on the substrate film, a color conversion functional layer including an organic fluorescent dye, light diffusing particles and a microcapsule phase change material including a shell and a core,
wherein the core comprises a phase change material being at least one selected from an organic monomer, a polymer and an inorganic salt hydrate;
wherein the light diffusing particles comprise particles including TiO2, silica, borosilicate, alumina, or sapphire; polymer particles including polystyrene, polycarbonate, polymethyl methacrylate, acryl, methyl methacrylate, styrene, melamine resin, formaldehyde resin, or melamine and formaldehyde resins; or combinations thereof; and
wherein the organic fluorescent dye includes at least one selected from BODIPY-based derivatives, acridine-based derivatives, xanthene-based derivatives, arylmethane-based derivatives, coumarin-based derivatives, polycyclic aromatic hydrocarbon-based derivatives, polycyclic hetero aromatic-based derivatives, perylene-based derivatives, pyrrole-based derivatives and pyrene-based derivatives.

11. The method for preparing the display apparatus comprising a backlight including a color conversion film of claim 10, wherein the forming of a color conversion functional layer includes: preparing a resin solution in which a resin, a solvent, the microcapsule phase change material, the light diffusing particles and an organic fluorescent dye are mixed; forming the color conversion functional layer by coating the resin solution on the substrate film; and drying the color conversion functional layer formed on the substrate film.

12. The method for preparing the display apparatus comprising a backlight including a color conversion film of claim 10, wherein the forming of a color conversion functional layer includes: forming a color conversion layer including light diffusing particles on the substrate film; and forming a phase transformation layer including the microcapsule phase change material on the color conversion layer.

* * * * *